(12) United States Patent
Abugharbieh et al.

(10) Patent No.: US 8,358,156 B1
(45) Date of Patent: Jan. 22, 2013

(54) VOLTAGE MODE LINE DRIVER AND PRE-EMPHASIS CIRCUIT

(75) Inventors: Khaldoon S. Abugharbieh, San Jose, CA (US); Mark J. Marlett, Livermore, CA (US)

(73) Assignee: Xilinx, Inc., San Jose, CA (US)

( * ) Notice: Subject to any disclaimer, the term of this patent is extended or adjusted under 35 U.S.C. 154(b) by 252 days.

(21) Appl. No.: 12/790,482

(22) Filed: May 28, 2010

(51) Int. Cl.
H03B 1/00 (2006.01)
(52) U.S. Cl. ........................................................ 327/108
(58) Field of Classification Search .................. None
See application file for complete search history.

(56) References Cited

U.S. PATENT DOCUMENTS
2010/0117690 A1* 5/2010 Doi ............................... 327/108

OTHER PUBLICATIONS

Cases et al., "Transient Response of Uniformly Distributed RLC Transmission Line", IEEE Transactions on Circuits and Systems, vol. CAS-27, No. 3, Mar. 1980, pp. 200-207.
Fiedler, A., "A 1.0625GB/s Transceiver with 2-x Oversampling and Transmit Signal Pre-emphasis", 1997 IEEE International Solid State Circuits Conference, ISSCC97, Session 15, Serial Data Communications, Paper FP 15.1, Feb. 7, 1997, pp. 238-239; 464.
Zhang et al., "Transmit Pre-Emphasis and Receive Equalization", Whitepaper, Mindspeed Technologies, Oct. 31, 2002, 8 pp.
Sridhara, et al., "System Design of a Low-Power I/O Link", Conference Record of the Thirty-Seventh Asilomar Conference on Signal, Systems and Computers, Nov. 2003, pp. 1468-1472, vol. 2.
Choi et al., "A Three-Data Differential Signaling Over Four Conductors With Pre-Emphasis and Equalization: A CMOS Current Mode Implementation", IEEE Journal of Solid-State Circuits, vol. 41, No. 3, Mar. 2006, pp. 633-641.
Schrader, J.R. et al., "Pulse-Width Modulation Pre-Emphasis Applied in a Wireline Transmitter, Achieving 33 dB Loss Compensation at 5-Gb/s in 0.13- μm CMOS", IEEE Journal of Solid-State Circuits, vol. 41, No. 4, Apr. 2006, pp. 990-999.
Cheng, D., et al., "A Reduced Power 6-Tap Pre-Emphasis for 10GB/s Backplane Communications", 24th Biennial Symposium on communications, Jun. 2008, pp. 93-94.
Kossel, M. et al., "A T-Coil-Enhanced 8.5 Gb/s High-Swing SST Transmitter in 65 nm Bulk CMOS with < - 16 dB Return Loss Over 10 GHz Bandwidth", IEEE Journal of Solid-State Circuits, vol. 43, No. 12, Dec. 2008, pp. 2905-2920.

* cited by examiner

Primary Examiner — Lincoln Donovan
Assistant Examiner — Daniel Rojas
(74) Attorney, Agent, or Firm — LeRoy D. Maunu

(57) ABSTRACT

In one embodiment of the invention, a voltage-mode line driver circuit is provided for transmitting a differential signal. The voltage-mode line driver includes a first voltage swing circuit having an input coupled to receive an input signal and an output coupled to a first transmission line. A second voltage swing circuit is included, the second voltage swing circuit having an input coupled to receive an inversion of the input signal and an output coupled to a second transmission line. First and second pre-emphasis circuits are respectively coupled to the first and second voltage swing circuits. The first and second pre-emphasis circuits are configured to supplement the slew rate of respective first and second voltage swing circuits in response to a transition of the input signal.

18 Claims, 8 Drawing Sheets

VOLTAGE MODE LINE DRIVER AND PRE-EMPHASIS CIRCUIT

FIELD OF THE INVENTION

One or more embodiments generally relate to digital signal transmission circuits.

BACKGROUND

When a high-speed signal is travelling through a long transmission channel, the signal will be degraded due to the channel's bandwidth limitations. There are two main mechanisms that attenuate high-frequency signals in transmission lines: the skin effect and dielectric absorption. The skin effect is the tendency of high-frequency signals to travel on the surface of the material, causing an increase in inductive reactance. Dielectric absorption arises from the tendency of high-frequency signals to excite molecules of insulating material adjacent to the signal line. As a result, energy is absorbed and signal strength is reduced.

The frequency response of a transmission channel can be modeled as a low-pass transfer function, as shown in equation:

$$Atten = d \ast ((K\sin \ast sqrt(f)) + (K\text{dielectric} \ast f))$$

where d is the length of the transmission line and f is the frequency of operation. Kskin is a constant that is inversely proportional to the skin depth of the conductor and the width of the transmission line. Kdielectric is also a constant that is proportional to the material dissipation factor and square root of the real part of the dielectric constant.

In digital signaling the highest frequencies comprise signal transitions such as the rising and falling edges of a binary data symbol. When the data rate is sufficiently high, the binary data transitions cannot complete transition within a symbol interval, and symbol energy will spread into the adjacent symbols. This spreading of symbol energy is defined as inter-symbol interference (ISI). To reduce the effect of ISI, the signal amplitude is boosted during transition, which amounts to a high-frequency boost in the frequency domain. This boost is referred to as high-frequency emphasis. High-frequency emphasis of the signal may also be referred to as pre-emphasis and such terms are used interchangeably herein. A pre-emphasis circuit acts as an equalizer that boosts the high-frequency component and compensates for attenuation of the signal as the signal is transmitted through the channel.

The majority of transmit driver circuits with pre-emphasis utilize current mode logic (CML) based topologies. In current mode line drivers, the output state has two linear 50 ohm resistors to the power supply, two differential pairs, a main tail current source and an auxiliary tail current source. The auxiliary tail current emphasizes the signal when enabled. Both tail currents can be programmable depending on the steady state output voltage swing and the amount of voltage boost required.

While the current mode logic topology may offer a good return loss performance because the internal linear resistors can be accurately matched to the external load resistance, it is inefficient from a power usage standpoint. In order to perform pre-emphasis in a current mode logic based topology, the main and auxiliary tail currents must be four times the load current in order to sustain the proper steady and emphasized voltage levels of the output signal. As a result, when the maximum differential voltage increases due to an increase in boost, the output stage current will increase by a factor of four. The pre-driver circuit also consumes a significant amount of power as it needs to drive the gate to the source capacitance of the differential pairs of the output stage.

One or more embodiments of the present invention may address one or more of the above issues.

SUMMARY

In one embodiment, a voltage-mode line driver circuit is provided for transmitting a differential signal. The voltage-mode line driver includes a first voltage swing circuit having an input coupled to receive an input signal and an output coupled to a first transmission line. A second voltage swing circuit is included, the second voltage swing circuit having an input coupled to receive an inversion of the input signal and an output coupled to a second transmission line. First and second pre-emphasis circuits are respectively coupled to the first and second voltage swing circuits. The first and second pre-emphasis circuits are configured to supplement the slew rate of respective first and second voltage swing circuits in response to a transition of the input signal.

In another embodiment, a single-ended signaling driver circuit is provided. The single-ended signaling driver circuit includes, a first MOSFET voltage swing circuit having an input coupled to receive an input signal and an output coupled to a transmission line. A pre-emphasis circuit is coupled to the first MOSFET voltage swing circuit. The emphasis circuit is configured to supplement the slew rate of the driver circuit in response to a transition of the input signal. The single-ended signaling driver circuit maintains a substantially uniform impedance while processing high-frequency and low-frequency input signals.

In yet another embodiment, a voltage-mode differential signaling circuit is provided. The voltage-mode differential signaling circuit includes an amplifier circuit having an input coupled to receive an input signal and an output coupled to a first output of the voltage mode differential amplifier circuit. The differential signaling circuit also includes a second amplifier circuit having an input coupled to receive an inversion of the input signal and an output coupled to a second output of the voltage mode differential amplifier circuit. First and second pre-emphasis circuits are coupled and configured to respectively supplement the output gain provided by the first and second amplifier circuits in response to a high-frequency transition of the input signal. The voltage-mode differential signaling circuit is configured to maintain a substantially uniform internal impedance across the first and second outputs while processing high-frequency and low-frequency portions of the input signal.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which.

DETAILED DESCRIPTION OF THE DRAWINGS

In digital signal transmission, high-frequency signals are attenuated while the signal is travelling through the transmission channel. Pre-emphasis circuitry may be used to increase the signal strength of high-frequency portions of a digital signal to compensate for high-frequency loss during transmission. If the impedance of emphasis and driver circuits is not matched to the load impedance of the transmission channel, noise will be generated in the channel due to the reflected signals at locations of impedance mismatch. Most existing line driver circuits that perform high-frequency emphasis utilize current-mode logic topologies. Current mode line driver circuits provide good return loss performance because the current mode logic circuitry can be designed to have a uniform impedance. However, current mode line drivers are power inefficient due to the requirements of current mode logic topologies. One or more disclosed embodiments provide a power efficient voltage mode (VML) line driver circuit for performing pre-emphasis of high-frequency signals. The voltage mode line driver circuit is configured to have a uniform impedance that can be matched to the transmission channel.

The disclosed embodiments may be better understood with an explanation of pre-emphasis and current-mode line drivers. Pre-emphasis refers to the increasing of a signal magnitude to compensate for the high-frequency loss in the transmission channel. Because high-frequency components of a transmitted signal are attenuated more than low-frequency components, boosting the entire signal would result in increasing low-frequency noise. In pre-emphasis of a digital signal, only high-frequency transitions of signals between low and high states are emphasized. In this manner, a line driver circuit may compensate for attenuation of high-frequencies during transmission without amplifying noise and jitter present at low-frequencies.

Figure 1:
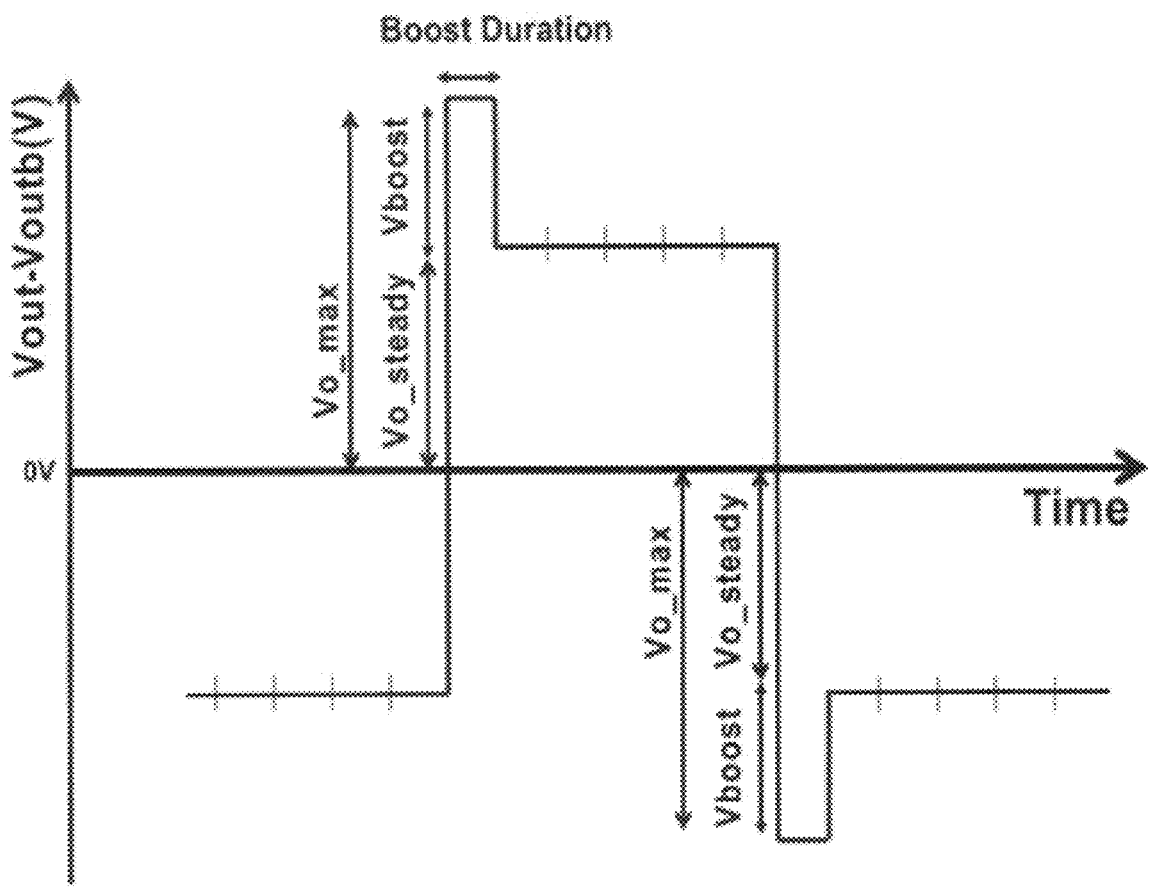
FIG. 1 illustrates a graph of an emphasized signal waveform.

FIG. 1 shows an example signal waveform output from a transmitter with emphasis added to high-frequency transitions subject to attenuation. The differential output voltage is given by $$V_{0\_max} = V_{0\_steady} + V_{boost}$$

where $V_{0\_steady}$ is the steady state differential output voltage, and $V_{boost}$ is the voltage boost when a transition takes place. By increasing the amplitude or the duration of the boost, post-attenuation of the high-frequency gain can be adjusted. Increasing the amplitude increases the slope of the emphasis boost. Increasing the duration lowers the starting frequency of the emphasis boost. The amplitude and duration of the boost required to minimize ISI depend on the channel loss of the particular channel.

Figure 2:
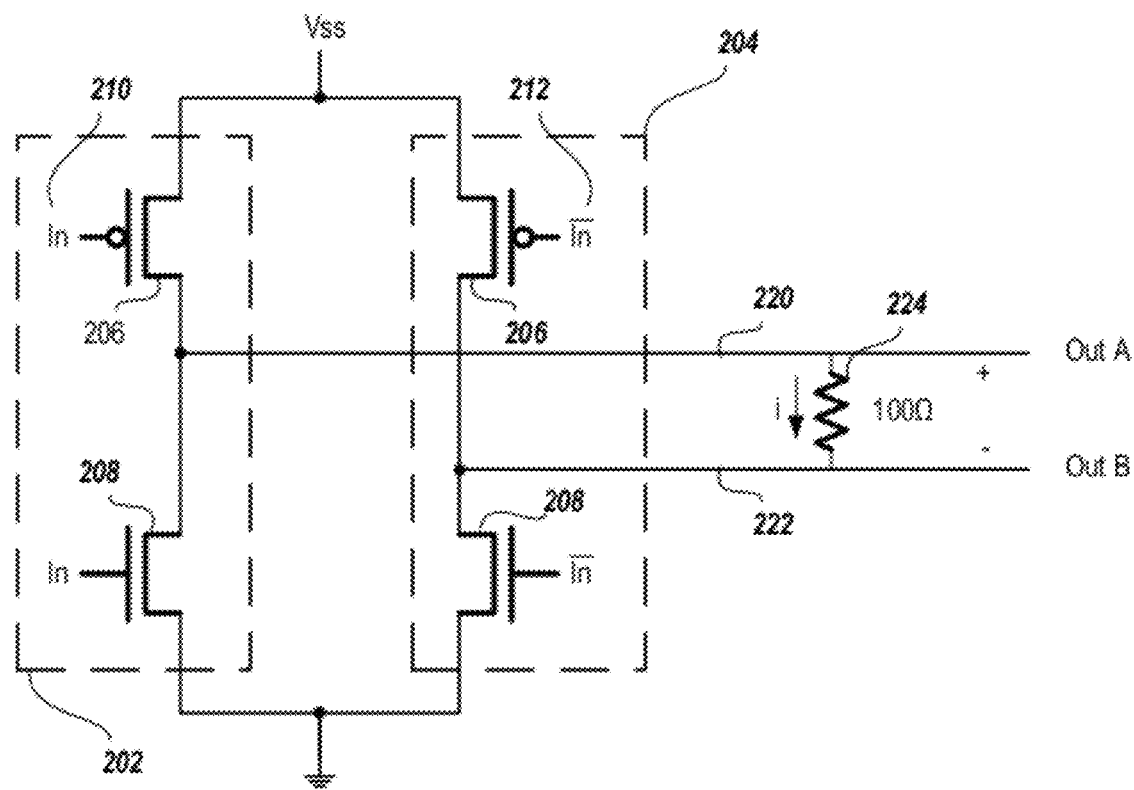
FIG. 2 is a circuit diagram of an example voltage mode driver circuit without emphasis circuitry.

FIG. 2 is a circuit diagram of an example voltage mode line driver circuit for differential signaling without high-frequency emphasis circuitry. In this example, the voltage mode line driver circuit is configured to output a differential signal on transmission lines 220 and 222. The differential signal is the difference between two complementary signals respectively output on the transmission lines. The complementary signals output by the voltage-mode driver are generated by first and second voltage swing circuits 202 and 204. The first voltage swing circuit 202 is driven by an input signal 210 to generate a first output signal. The second voltage swing circuit 204 is driven by input signal 212, which is the inverse of input signal 210, to generate the complementary output signal.

In this example, the voltage swing circuits each include a pull-up transistor 206 and a pull-down transistor 208. The pull-up and pull-down circuits are implemented using respective PMOS and NMOS transistors. The pull-up and pull-down circuits are coupled to form an inverter circuit. In the inverter circuit arrangement, the drain of the PMOS is coupled to the drain of the NMOS to form an output, and the gates are coupled together to form an input. The output of each inverter circuit is coupled to one of the transmission lines.

The sizing of the PMOS and NMOS transistors is chosen to match an impedance of the transmission lines. If impedance of the line driver does not match the impedance of the transmission line, the transmitted signal will not be fully absorbed at the receiver and excess energy will be reflected back and forth in the transmission line as noise. In the above example, the transistors are sized so that their impedances are matched to 50Ω to provide a 100Ω internal chip termination. As a result, the differential output ($V_{Out}$) measured across the 100Ω transmission line impedance is one-half of the difference between the high source voltage (Vss) and the low ground voltage (Gnd) as shown by, $$Vout = Vss - Gnd * \frac{100\Omega}{50\Omega + 50\Omega + 100\Omega} = \frac{Vss - Gnd}{2}$$

Because the impedances of PMOS and NMOS transistors change with process and temperature, and the impedance may become nonlinear as the voltage swing changes, the sizing may be further tuned for optimal impedance control.

Another type of voltage-mode driver implements single-ended signaling. In signal-ended signaling, a varying signal is transmitted on one transmission line and a reference voltage is transmitted on the other transmission line. A voltage-mode driver for single-ended signaling may be implemented with a single voltage swing circuit included to drive one of the transmission lines. The other transmission line is coupled to a reference voltage. For ease of discussion, the following embodiments and implementations are primarily described in terms of differential signaling implemented using the voltage swing circuits illustrated in FIG. 2. One skilled in the art will recognize that the various embodiments may be implemented with a number of other voltage swing circuits and may be used for either differential or single-ended signaling.

In one embodiment, a voltage mode line driver circuit is implemented with pre-emphasis circuitry including voltage swing circuits that are driven by the output of one or more previous symbols of the digital signal. High-frequencies subject to attenuation are detected by recognizing high-to-low and low-to-high transitions in the input signal using the current and previous values. When a discrepancy exists between the current and previous signals, a high-frequency transition is assumed to have occurred and the signal is emphasized by a selected voltage for a selected duration. The output is emphasized by supplementing the slew rate of the voltage swing circuits 202 and 204, increasing the voltage swing provided by the pull-up and pull-down circuits of each respective voltage swing circuit. In this manner the amplitude of the output signal is increased to emphasize the signal.

Figure 3:
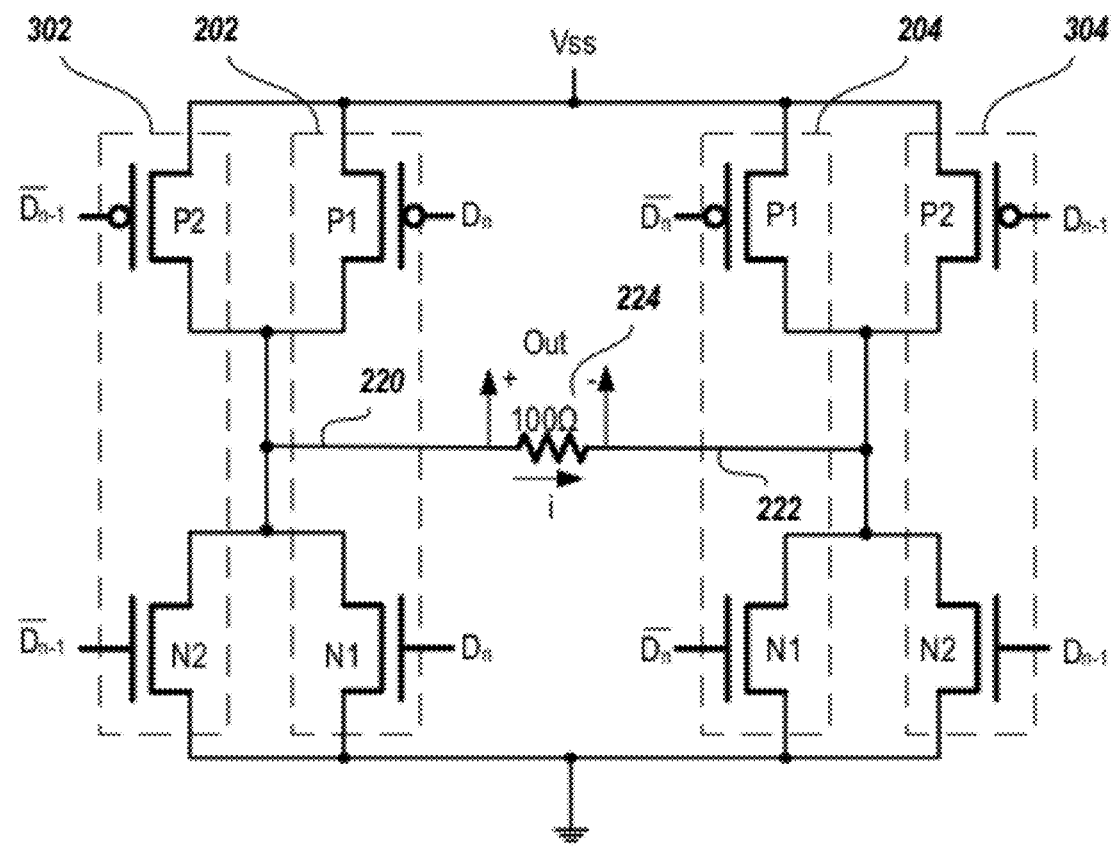
FIG. 3 is a circuit diagram of an example voltage mode driver with emphasis circuitry driven by an inversion of the delayed input signal in accordance with one embodiment.

FIG. 3 shows a circuit diagram of the example voltage-mode driver shown in FIG. 2 with pre-emphasis circuits implemented in accordance with one embodiment. Pre-emphasis circuits 302 and 304 are respectively coupled in parallel with voltage swing circuits 202 and 204. Outputs of pre-emphasis circuits 302 and 304 are respectively coupled to transmission lines 220 and 222 having an external impedance load 224. In this example, the pre-emphasis circuits are each implemented with a voltage swing circuit. Pre-emphasis circuits 302 and 304 are respectively driven by the inverse of the preceding value ($D_{n-1}$) input to voltage swing circuits 202 and 204. The preceding value may be acquired by delaying the input value with an inverter or register for an amount of time. The input value $D_n$ may be delayed by a fraction or multiple of the signal period to generate $D_{n-1}$ High-frequencies that are subject to attenuation are detected by checking for high-to-low and low-to-high transitions in the input signal. For example, the PMOS pull-up circuit of voltage swing circuit 202 will be active when input $D_n$ is low. If the previous input $D_{n-1}$ is high, when $D_n$ is low, a high-to-low transition has occurred and emphasis should be added to the signal output from the voltage swing circuit. Therefore, the PMOS pull-up transistor, P2, of the parallel coupled pre-emphasis circuit 304 is driven with the inverse of previous input, $D_{n-1}$, to enable pre-emphasis circuit 302 when $D_{n-1}$ is high. Table 1 illustrates the behavior of the voltage swing circuit 202 and pre-emphasis circuit 302. Voltage swing circuit 204 and pre-emphasis circuits 304, which are coupled to transmission line 222, exhibit similar behavior with inverted input and output values. In this example, it is assumed that P2 and N2 have higher effective device resistances than P1 and N1 and that P1 and N1 have comparable device resistances.

TABLE 1

| $D_{n-1}$ | $D_n$ | P1 | P2 | N1 | N2 | Output $V_0$ @ 220 |
|---|---|---|---|---|---|---|
| Low | Low | On | Off | Off | On | Vss/2 < Vo < 3 Vss/4 |
| High | Low | On | On | Off | Off | $V_0$ = 3 Vss/4 |
| Low | High | Off | Off | On | On | $V_0$ = Vss/4 |
| High | High | Off | On | On | Off | Vss/4 < Vo < Vss/2 |

When $D_n$ transitions low-to-high ($D_{n-1}$=0, $D_n$=1), both pull-down transistors N1 and N2 coupled to transmission line 220 are enabled. As a result, the output voltage on transmission line 220 will be near Vss/4 voltage. When $D_n$ transitions high-to-low ($D_{n-1}$=1, $D_n$=0), both pull-up transistors P1 and P2 on transmission line 220 are enabled. As a result, the output voltage on transmission line 220 will be near source voltage (3*Vss/4).

Because the voltage swing circuits, which are coupled to the transmission lines, are driven by complementary input signals, one transmission line will be set to 3*Vss/4 and the other to Vss/4 during transitions. The differential output ($V_{out}$) measured across the 1000 transmission line impedance is described by, $$Vout = \frac{V_{SS}}{R_{P1}\|R_{P2} + 100\Omega + R_{N1}\|R_{N2}} * 100$$

wherein $R_{P1}\|R_{P2}$ denotes the parallel impedance of transistors P1 and P2 on each of the transmission lines.

If the input signal $D_n$ is thereafter maintained low ($D_{n-1}$=0, $D_n$=0), pull-up transistor P1 and pull-down transistor N2, which are coupled to transmission line 220 will be enabled. In this state, a current path is simultaneously provided from Vss and from Gnd to the output transmission line 220. As a result the output voltage will be less than the maximum voltage 3*Vss/4. The particular output voltage on transmission line 220 will depend on the relative sizing of transistors P1 and N2. For example, if the gate dimensions are sized such that P1 and N2 pass equal currents, the output voltage on transmission line 220 will equal Vss/2. If N2 is selected to have gate dimensions such that P1 passes more current than N2, the output voltage will be greater than Vss/2. In order to match impedances of the transmission lines, the transistors should be sized such that, $$R_{P1}\|R_{N2}=R_{N1}\|R_{P2}=R_{N1}\|R_{N2}=R_{P1}\|R_{P2}=50\Omega$$

This ensures that the line driver exhibits the same impedance when pre-emphasis circuits are active and inactive.

Similarly, when input signal $D_n$ is thereafter maintained high ($D_{n-1}$=1, $D_n$=1), pull-down transistor N1 and pull-up transistor P2 coupled to transmission line 220 will be enabled. In this state, a current path is also simultaneously provided from Vss and from Gnd to the output transmission line. The output voltage on transmission line 220 will be a value dependent on the relative sizing of N1 and P2 transistors as discussed above.

In the above example, each voltage swing circuit is coupled to one pre-emphasis circuit. One skilled in the art will recognize that two or more pre-emphasis circuits may be included to supplement each voltage swing circuit. For example, each voltage swing circuit 202 and 204 shown in FIG. 3 may be coupled to two pre-emphasis circuits implemented as shown by 302 or 304. The two pre-emphasis circuits coupled to each voltage swing circuit is driven by a previous input symbol. One skilled in the art will recognize that the two pre-emphasis circuits may be driven by different instances of previous symbols. For example, one of the pre-emphasis circuits may be driven by the previous symbol $D_{n-1}$ and the other pre-emphasis circuit may be driven by the previous symbol $D_{n-2}$. Other input configurations and additional pre-emphasis circuits may be utilized in a similar fashion as desired.

Figure 4:
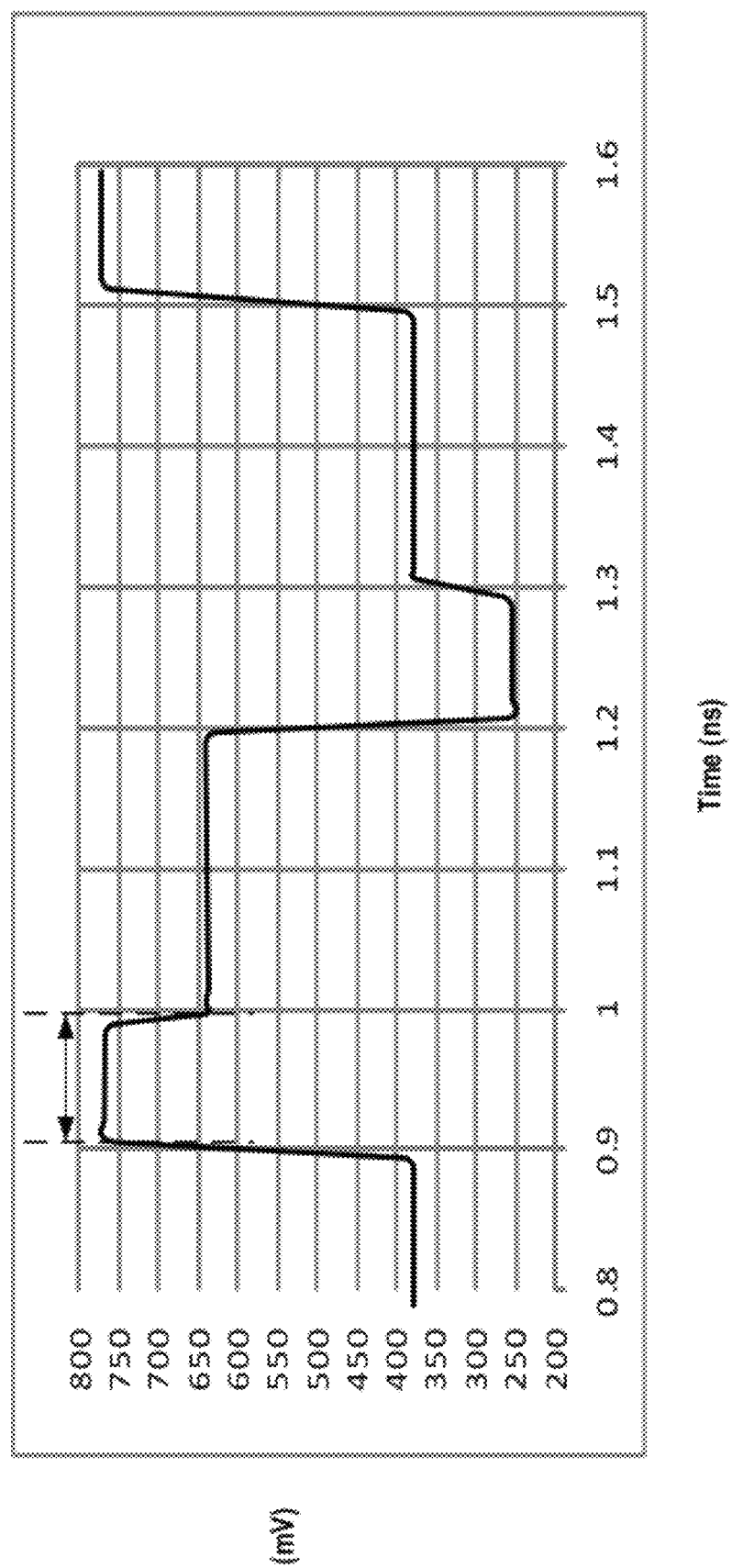
FIG. 4 is a graph of an example emphasized signal waveform output from the circuit of FIG. 3.

FIG. 4 is a graph of an example emphasized signal waveform output from voltage swing circuit 202 and pre-emphasis circuit 302 of FIG. 3. In this example illustration, Vss is equal to 1V. In the time period from 0.8 to 0.9 nano-seconds (ns) and from 1.3 to 1.5 ns, $D_n$ is maintained high ($D_{n-1}$=1, $D_n$=1) and transistors N1 and P2, which are coupled to transmission line 220, are enabled. In this example, N1 is selected to pass more current than P2. As a result, the output voltage of transmission line 220 is set to a voltage that's less than Vss/2 (500 mV), but higher than Vss/4 (250 mV).

At 0.9 and 1.5 ns, $D_n$ transitions from high to low, enabling pull-up transistors P1 and P2, which are coupled to transmission line 220. Because both pull-up transistors are enabled and the pull-down transistors are disabled, the resulting output signal on transmission line 220 is near 3*Vss/4=750 mV.

In the time period from 1 ns to 1.2 ns, $D_n$ is maintained low ($D_{n-1}$=0, $D_n$=0), and transistors P1 and N2, which are coupled to transmission line 220 are enabled. In this example, P1 passes more current than N2. As a result, the output voltage is set to a voltage that's higher than Vss/2 but less than 3*Vss/4.

At 1.2 ns, $D_n$ transitions from low to high, enabling pull-down transistors N1 and N2 coupled to transmission line 220.

Because both pull-up transistors are disabled and pull-down transistors are enabled, the resulting output signal is near Vss/4 (~250 mV).

Voltage swing circuit 204 and pre-emphasis circuit 304 of FIG. 3 will exhibit similar behavior with input and output signals inverted. The resulting differential signal on transmission lines will have a maximum differential amplitude of about VSS/2 (500 mV).

In another embodiment, the pre-emphasis circuits are implemented with voltage swing circuits driven by the output of one or more high-pass filter circuits. The high-pass filter circuits forward signals to enable the pre-emphasis circuits when signals are high-frequencies such as high-to-low and low-to-high transitions.

Figure 5:
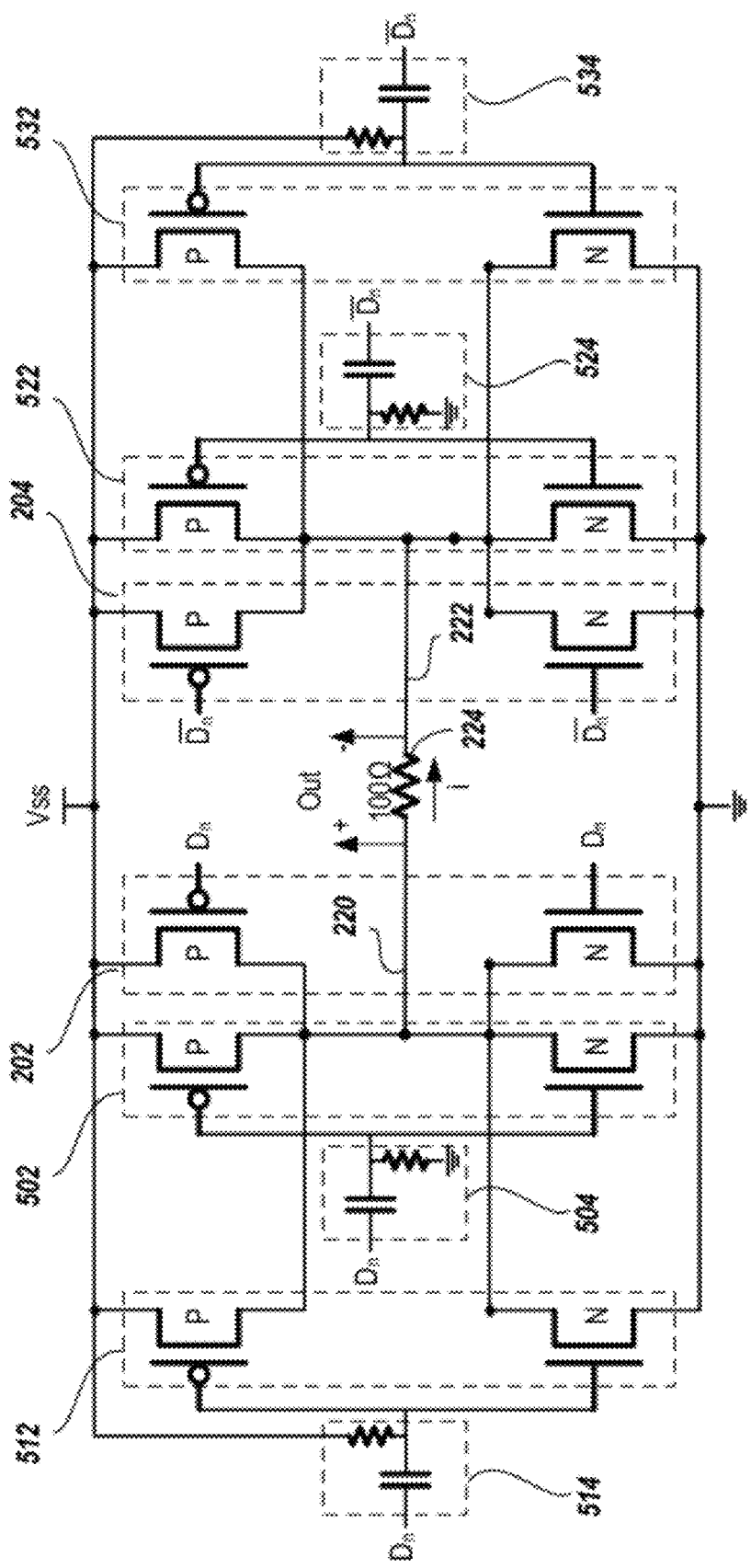
FIG. 5 is a circuit diagram of an example voltage mode driver with high-pass filters used to detect signal transitions and enable emphasis in accordance with one embodiment.

FIG. 5 is a circuit diagram of an example voltage mode driver with high-pass filters used to detect high-frequency signal transitions and enable pre-emphasis in accordance with one embodiment. Voltage swing circuits 202 and 204 are respectively coupled to transmission lines 220 and 222 having external impedance load 224. Each one of voltage swing circuits 202 and 204 is coupled in parallel with two pre-emphasis circuits. On transmission line 220, voltage swing circuit 202 is coupled in parallel with first and second pre-emphasis circuits. In this example, the first and second pre-emphasis circuits are implemented with respective voltage swing circuits 502 and 512, driven by high-pass filters 504 and 514, respectively.

In this example, high-pass filter 514 is a first-order passive RC high-pass filter circuit with the resistor tied to Vss. When low-frequency signals are input, the output of the high-pass filter is Vss. When high-frequency signals are received, they are passed to the input gates of voltage swing circuit 512. High-pass filter 504 is a first-order passive RC high-pass filter circuit with the resistor tied to Gnd. When low-frequency signals are input, the output of the high-pass filter is Gnd. When high-frequency signals are received they are passed to the input gates of voltage swing circuit 502. The cutoff frequency (f) of the high-pass filter circuits 504 and 514 is determined by the resistance R and capacitance C of the circuit as shown, $$f = \frac{1}{2\pi RC}$$

where f is in hertz, R is in ohms, and C is in farads. One skilled in the art will recognize that other high-pass and low-pass filters may be used to selectably enable pre-emphasis of the signal.

Table 2 illustrates the behavior of the voltage swing circuit and pre-emphasis circuits tied to transmission line 220. When $D_n$ is a high-frequency signal, such as low-to-high and high-to-low transitions, high-pass filters 504 and 514 will pass the high-frequency components to the input gate terminals of respective voltage swing circuits 502 and 512. When $D_n$ exhibits a low-to-high transition, a high voltage value will be input to each of the voltage swing circuits. As a result, the pull-down transistors of all three voltage swing circuits will be enabled and the output voltage on transmission line 220 will be near Gnd. When $D_n$ exhibits a high-to-low transition, a low voltage value will be input to each of the voltage swing circuits. As a result, the pull-up transistors of all three voltage swing circuits will be enabled and the output voltage on transmission line 220 will be near Vss.

TABLE 2

| $D_n$ | HPF 504 | Voltage swing 502 | HPF 514 | Voltage swing 512 | Voltage swing 202 | Overall |
|---|---|---|---|---|---|---|
| Low | Low | Pull-up | High | Pull-down | Pull-up | Pull-up ×1 |
| Low-high | High | Pull-down | High | Pull-down | Pull-down | Pull-down ×3 |
| High | Low | Pull-up | High | Pull-down | Pull-down | Pull-down ×1 |
| High-low | Low | Pull-up | Low | Pull-up | Pull-up | Pull-up ×3 |

When $D_n$ is a steady low signal or steady high signal, high-pass filters 504 and 514 block the low-frequency components and output a low signal and a high signal respectively. As a result, the pull-up transistor of voltage swing circuit 502 is enabled and the pull-down transistor of the voltage swing circuit 512 is enabled. If $D_n$ is low, two pull-up transistors and one-pull-down transistor will be enabled. As a result, the output voltage on transmission line 220 will be greater than the Vss/2 voltage and less than Vss. If $D_n$ is high, two pull-down transistors and one pull-up transistor will be enabled. As a result, the output voltage on transmission line 220 will be less than the Vss/2 voltage and greater than Gnd.

On transmission line 222, voltage swing circuit 204 is coupled in parallel with voltage swing circuits 522 and 532, which are respectfully driven by high-pass filters 524 and 534. The high-pass filters and voltage swing circuits, which are coupled to transmission line 222, exhibit identical behavior to the high-pass filters and voltage swing circuits, which are coupled to transmission line 220, with input and output values inverted.

During signal transition, three pull-up transistors that are coupled to one transmission line are enabled and three pull-down transistors that are coupled to the other transmission line are enabled. The resulting internal impedance of the line driver is given by, $$Z = \frac{R_P}{3} + \frac{R_N}{3} = 100\Omega$$

When the input signal is not in transition, two pull-up transistors and one pull-down transistor coupled to one transmission line are enabled and two pull-down transistors and one pull-up transistor coupled to the other transmission line are enabled. The resulting internal impedance of the line driver is given by, $$Z = \frac{R_P}{2} \| R_N + \frac{R_N}{2} \| R_P = 100\Omega$$

Therefore, in order to match the impedance of the transmission lines, the transistors should be sized such that, $$\frac{R_P}{3} = \frac{R_N}{3} = 50\Omega$$

In this manner, the circuit maintains a matched impedance and ensures a good signal quality.

Figure 6:
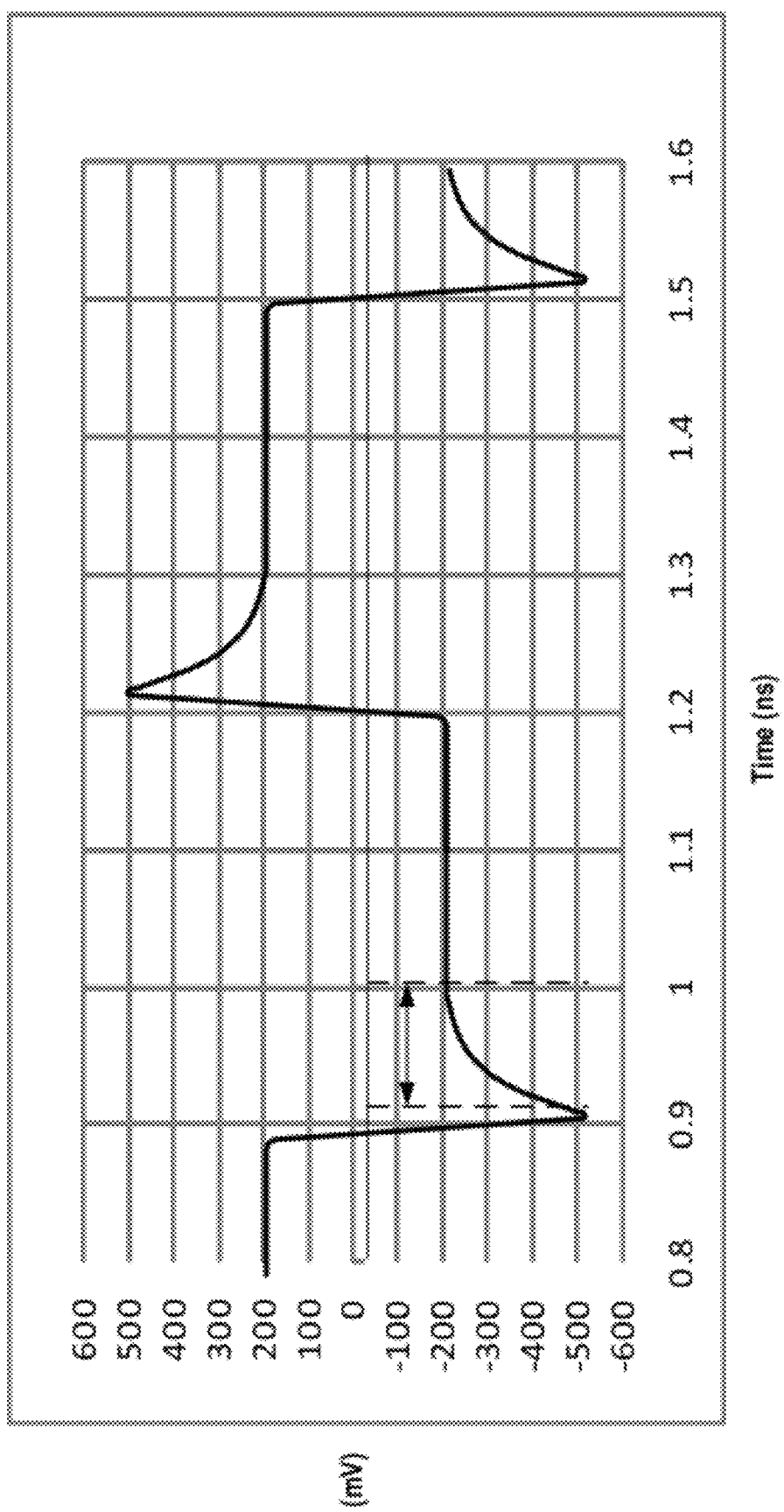
FIG. 6 is a graph of an example pre-emphasized signal waveform output from the circuit of FIG. 5.

FIG. 6 shows a graph of an example pre-emphasized differential signal output from the line driver circuit shown in FIG. 5. In this example illustration, the differential signal has an amplitude of about 1000 mV and a nominal reference voltage of 0 mV. In the time periods from 0.8 to 0.9 ns, 1.0 to 1.2 ns, and 1.3 to 1.5 ns, $D_n$ is a low-frequency steady input signal. As described above, two pull-up transistors and one pull-down transistor are enabled on one transmission line and two pull-down transistors and one pull-up transistor are enabled on the other transmission line. As a result, the amplitude of the differential output signal is less than the maximum.

At 0.9, 1.2, and 1.5 ns, $D_n$ exhibits a high-frequency low-to-high or high-to-low transition. As described above, the high-frequency signal enables three pull-up transistors on one transmission line and three pull-down transistors on the other transmission line. As a result, the amplitude of the differential output signal increases to the maximum value. Because the pre-emphasis is enabled by the high-pass filters, the signal strength increases during the high-frequency signal transitions and decreases to the steady state signal strength as $D_n$ becomes steady. The duration of the boost depends on the RC time constant.

Figure 7:
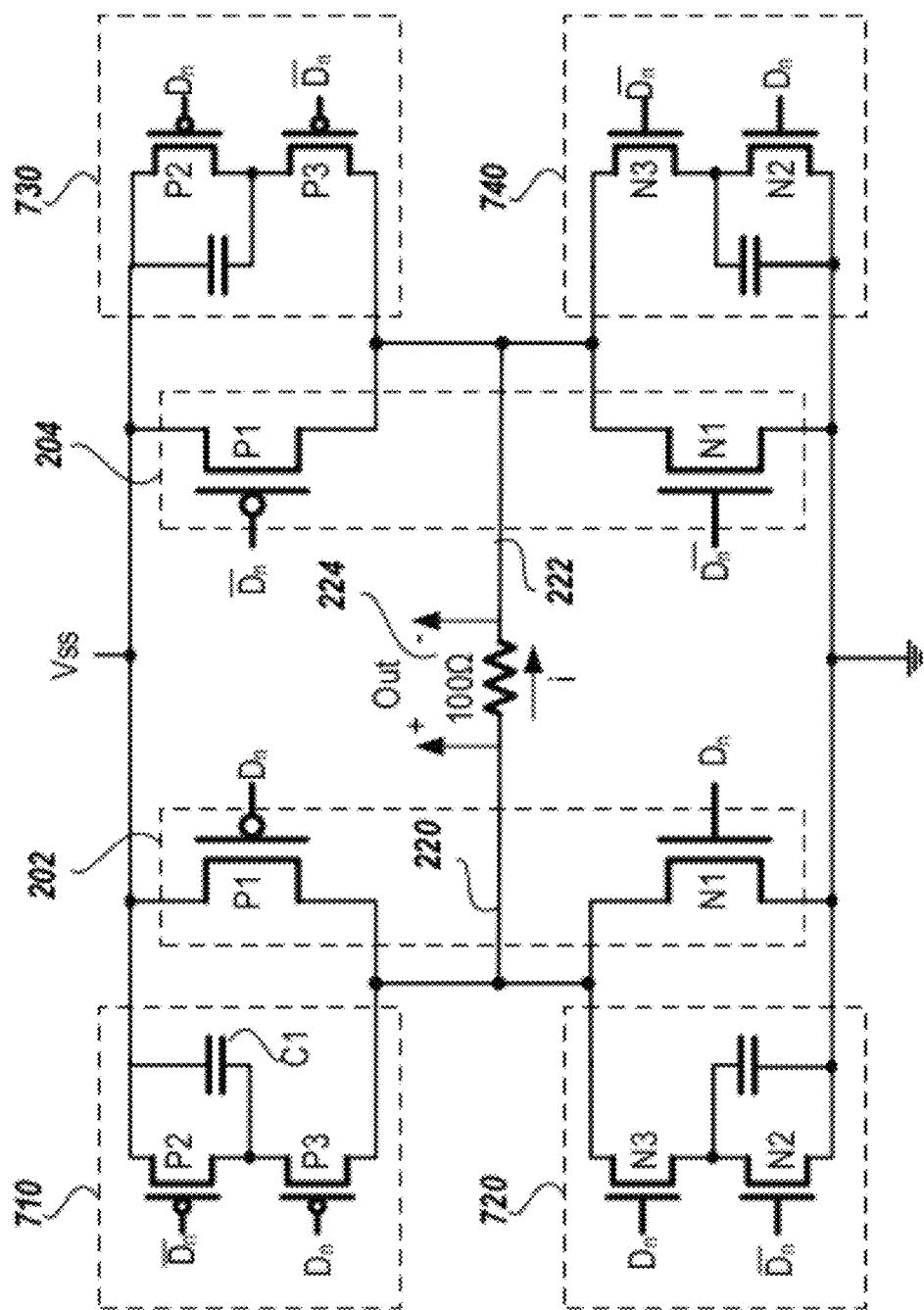
FIG. 7 is a circuit diagram of an example voltage mode driver with emphasis added to the signal by selectably passing current through a charging capacitor in accordance with one embodiment.

In another embodiment, the pre-emphasis is added by selectably passing current through a charging capacitor. FIG. 7 shows a circuit diagram of an example voltage mode line driver circuit implemented with switched capacitor pre-emphasis circuits. Voltage swing circuits 202 and 204 are respectively coupled to transmission lines 220 and 222 having load impedance 224. The pull-up transistors P1 of voltage swing circuits 202 and 204 are each coupled in parallel with respective switched capacitor pull-up circuits 710 and 730. The switched capacitor pull-up circuits 710 and 730 are each configured to charge a capacitor when the corresponding pull-up transistor P1 of the respective voltage swing circuits 202 and 204 is enabled, and configured to discharge the capacitor when the transistor becomes disabled. Similarly, the pull-down transistors N1 of voltage swing circuits 202 and 204 are each coupled in parallel with respective switched capacitor pull-down circuits 720 and 740. The switched capacitor pull-down circuits 720 and 740 are each configured to charge a capacitor when the corresponding pull-down transistor N1 is enabled and configured to discharge the capacitor when the transistor becomes disabled.

For example, when input signal $D_n$ transitions from high to low, pull-up transistor P1 of voltage swing circuit 202 and pull-down transistor N1 of voltage swing circuit 204 are enabled. Switched capacitor pull-up circuit 710 and pull-down circuit 740 begin charging their capacitors. While the capacitors are charging, current is passed through the charging capacitors to provide pre-emphasis to the signal. The current passing through the capacitors decreases as the charge on the capacitors increases, the current eventually decreasing to zero. In this manner, the pre-emphasis is only provided to the signal following transitions. The emphasis current (I) passed by one of the capacitors over time (t) is given by, $$I(t) = \frac{V}{R} e^{-\frac{t}{RC}}$$

where R is the resistance of the current path, and C is the capacitance of the capacitor in farads. V/R represents the initial current when the capacitor begins charging. Referring to switched capacitor pull-up circuit 710, the voltage V equals Vss minus the voltage at transmission line 220. The resistance R is equal to the resistance of the current path from the source voltage Vss, through the capacitor C1 and first transistor P3, to transmission line 210. A number of different circuits may be used to charge and discharge the capacitor. In this example implementation, the switched capacitor circuit 710 includes a capacitor C1 coupled in series with PMOS transistor P3. The series coupled capacitor and transistor form a path between the source voltage Vss and transmission line 220. Capacitor C1 is also coupled in parallel with PMOS transistor P2. When input signal $D_n$ is low, PMOS transistor P3 is enabled and couples capacitor C1 to transmission line 220. When input signal $D_n$ is high, PMOS transistor P2 is enabled, discharging the capacitor C1. In this example, signal $D_n$ is used to drive transistor P3 and the inversion of $D_n$ is used to drive transistor P2 is input. The circuit may be configured to charge and discharge the capacitor based on a number of other signals using different MOSFET transistor types. One skilled in the art would recognize that a number of other circuits may be used to selectably enable charging and discharging of the capacitor as well.

Figure 8:
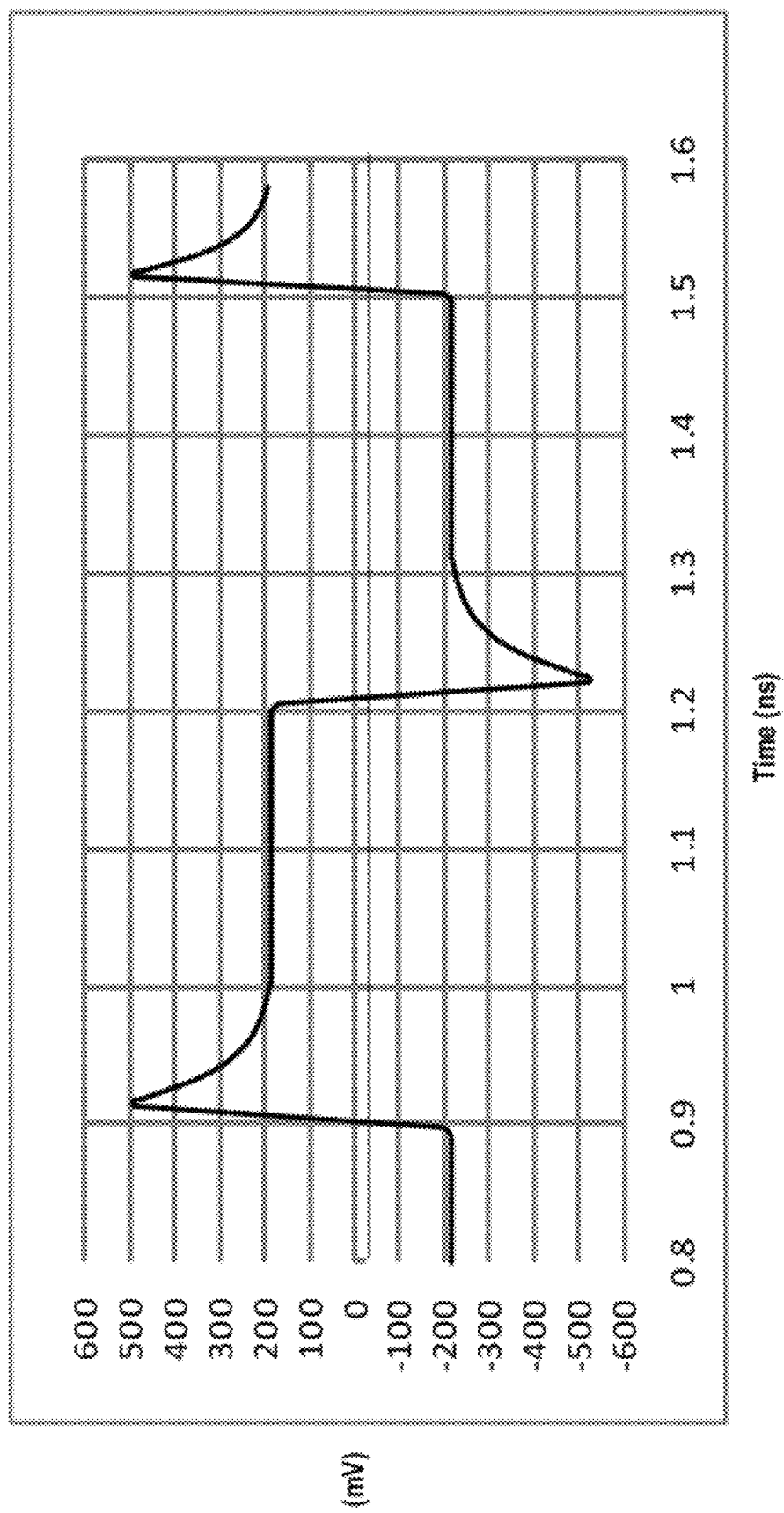
FIG. 8 is a graph of an example pre-emphasized signal waveform output from the circuit of FIG. 7.

FIG. 8 is a graph of an example pre-emphasized signal waveform output from the example circuit depicted in FIG. 7. In this example illustration, the differential signal has an amplitude of about 1000 mV and a nominal reference voltage of 0 mV. In the time periods from 0.8 to 0.9 ns, 1.0 to 1.2 ns, and 1.3 to 1.5 ns, input signal $D_n$ is steady and, as described above, the switched capacitor circuits are fully discharged. As a result, the amplitude of the differential output signal is less than the maximum.

At 0.9, 1.2, and 1.5 ns, $D_n$ exhibits a low to high or high to low transition. As a result, the two discharged capacitors begin charging. As described above, the charging of the capacitors passes additional current that pre-emphasizes the signal output on the transmission lines. As a result, the amplitude of the differential output signal increases to the maximum value. Because the pre-emphasis is enabled by the charging of the capacitors, the signal strength immediately increases following the signal transition and decreases exponentially until the capacitors reach a fully charged state. The duration ($t_d$) of the emphasis provided by the capacitor is given by, $$t_d = 5*RC$$

where R is the resistance of the current path and C is the capacitance of the capacitor in farads.

The embodiments are believed to be applicable to a variety of differential and single ended line driver circuit applications. Other aspects and embodiments will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A voltage-mode line driver circuit for transmitting a differential signal, comprising:
   a first voltage swing circuit having an input coupled to receive an input signal and an output coupled to a first transmission line;
   a second voltage swing circuit having an input coupled to receive an inversion of the input signal and an output coupled to a second transmission line; and
   first and second pre-emphasis circuits respectively coupled to the first and second voltage swing circuits, wherein the first and second pre-emphasis circuits are configured to supplement the slew rate of respective first and second voltage swing circuits in response to a transition of the input signal;

wherein the first pre-emphasis circuit is driven by an inversion of a first delayed value of the input signal, and the second pre-emphasis circuit is driven by the first delayed value of the input signal.

2. The voltage-mode line driver circuit of claim 1, wherein the voltage-mode line driver circuit is a CMOS voltage-mode line driver circuit, the first voltage swing circuit is a first MOSFET voltage swing circuit, and the second voltage swing circuit is a second MOSFET voltage swing circuit.

3. The voltage-mode line driver circuit of claim 1, wherein the voltage-mode line driver circuit maintains a substantially uniform internal impedance while processing high-frequency and low-frequency input signals.

4. The voltage-mode line driver circuit of claim 1, wherein the first voltage swing circuit and the second voltage swing circuit are amplifier circuits.

5. The voltage-mode line driver circuit of claim 4, wherein the first pre-emphasis circuit is configured to, in response to a high-frequency transition of the input signal, supplement an output gain provided by the first voltage swing circuit.

6. The voltage-mode line driver circuit of claim 5, wherein the second pre-emphasis circuit is configured to, in response to a high-frequency transition of the input signal, supplement an output gain provided by the second voltage swing circuit.

7. The voltage-mode line driver circuit of claim 2, wherein:
the first pre-emphasis circuit includes a third MOSFET voltage swing circuit having an input coupled to receive the inversion of the first delayed value of the input signal; and
the second pre-emphasis circuit includes a fourth MOSFET voltage swing circuit having an input coupled to receive the first delayed value of the input signal.

8. The voltage-mode line driver circuit of claim 7, wherein the first delayed value of the input signal is delayed about one period of the input signal.

9. The voltage-mode line driver circuit of claim 7, further comprising:
third and fourth pre-emphasis circuits respectively coupled to the first and second MOSFET voltage swing circuits, the third pre-emphasis circuit including a fifth MOSFET voltage swing circuit having an input coupled to receive an inversion of a second delayed value of the input signal, the fourth pre-emphasis circuit including a sixth MOSFET voltage swing circuit having an input coupled to receive the second delayed value of the input signal; and
wherein the second delayed value of the input signal is delayed by two or more periods of the input signal.

10. The voltage-mode line driver circuit of claim 7, wherein the first delayed value of the input signal is delayed by a fraction of one period of the input signal.

11. The voltage-mode line driver circuit of claim 2, wherein:
the first pre-emphasis circuit includes:
a first high-pass filter having an input coupled to receive the input signal; and
a third MOSFET voltage swing circuit having an input coupled to an output of the first high-pass filter and an output coupled to an output of the first MOSFET voltage swing circuit; and
the second pre-emphasis circuit includes:
a second high-pass filter having an input coupled to receive the inversion of the input signal; and
a fourth MOSFET voltage swing circuit having an input coupled to an output of the second high-pass filter and an output coupled to an output of the second MOSFET voltage swing circuit.

12. The voltage-mode line driver circuit of claim 11, wherein:
the first pre-emphasis circuit further includes:
a third high-pass filter having an input coupled to receive the input signal; and
a fifth MOSFET voltage swing circuit having an input coupled to an output of the third high-pass filter and an output coupled to an output of the first MOSFET voltage swing circuit;
the second pre-emphasis circuit further includes:
a fourth high-pass filter having an input coupled to receive the inversion of the input signal; and
a sixth MOSFET voltage swing circuit having an input coupled to an output of the fourth high-pass filter and an output coupled to an output of the second MOSFET voltage swing circuit; and
wherein the first and second high-pass filters are coupled to a ground voltage and the third and fourth high-pass filters are coupled to a source voltage.

13. The voltage-mode line driver circuit of claim 2, wherein the first pre-emphasis circuit includes:
a switched capacitor pull-up circuit selectably coupled between a source voltage and the first transmission line and configured to:
in response to the input signal being a low value, enable a first current path from the source voltage through a first capacitor to the first transmission line; and
in response to the input signal being a high value, disable the first current path and enable a second current path to discharge the first capacitor; and
a switched capacitor pull-down circuit selectably coupled between a ground voltage and the first transmission line and configured to:
in response to the input signal being a high value, enable a third current path from the first transmission line through a second capacitor to the ground voltage; and
in response to the input signal being a low value, disable the third current path and enable a fourth current path to discharge the second capacitor.

14. The voltage-mode line driver circuit of claim 13, wherein:
the switched capacitor pull-up circuit includes:
the first capacitor having one end coupled to the source voltage;
a first PMOS transistor having a source coupled to a second end of the first capacitor, a gate coupled to receive the input signal, and a drain coupled to the first transmission line; and
a second PMOS transistor having a source coupled to a first end of the first capacitor, a drain coupled to the second end of the first capacitor, and a gate coupled to receive the inversion of the input signal.

15. The voltage-mode line driver circuit of claim 13, wherein:
the switched capacitor pull-down circuit includes:
the second capacitor having one end coupled to the ground voltage;
a first NMOS transistor having a source coupled to a second end of the second capacitor, a gate coupled to receive the input signal, and a drain coupled to the first transmission line; and
a second NMOS transistor having a source coupled to a first end of the second capacitor, a drain coupled to the second end of the second capacitor, and a gate coupled to receive the inversion of the input signal.

16. The voltage-mode line driver circuit of claim 13, wherein the first pre-emphasis circuit further includes a third MOSFET voltage swing circuit having an input coupled to receive the inversion of the input signal and an output coupled to the first transmission line.

17. The voltage-mode line driver circuit of claim 16, wherein the first MOSFET voltage swing circuit is implemented with transistors having a first gate size and the third MOSFET voltage swing is implemented with transistors having a second gate size different from the first gate size.

18. The voltage-mode line driver circuit of claim 17, wherein the first MOSFET voltage swing circuit and the second MOSFET voltage swing circuit are MOSFET inverter circuits, and wherein:

each MOSFET inverter circuits includes a pull-up transistor of a first type and a pull-down transistor of a second type;

in each inverter circuit a gate of the pull-up transistor is coupled to a gate of the pull-down transistor forming an input; and the pull-up and pull-down transistors are coupled in series to form an output.

\* \* \* \* \*